(12) United States Patent
Yoshida (10) Patent No.: US 9,812,516 B2
(45) Date of Patent: Nov. 7, 2017

(54) DISPLAY PANEL

(71) Applicant: JOLED INC., Tokyo (JP)

(72) Inventor: Hidehiro Yoshida, Hyogo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/033,746

(22) PCT Filed: May 22, 2015

(86) PCT No.: PCT/JP2015/002602
§ 371 (c)(1),
(2) Date: May 2, 2016

(87) PCT Pub. No.: WO2015/182096
PCT Pub. Date: Dec. 3, 2015

(65) Prior Publication Data
US 2016/0240596 A1    Aug. 18, 2016

(30) Foreign Application Priority Data

May 27, 2014   (JP) .................................. 2014-108699

(51) Int. Cl.
*H01L 27/32*   (2006.01)
*H01L 51/00*   (2006.01)
*H01L 51/56*   (2006.01)

(52) U.S. Cl.
CPC ...... *H01L 27/3246* (2013.01); *H01L 27/3218* (2013.01); *H01L 51/0005* (2013.01); *H01L 51/56* (2013.01); *H01L 2227/323* (2013.01)

(58) Field of Classification Search
CPC . H01L 27/3246; H01L 27/3218; H01L 51/56; H01L 51/0005; H01L 2227/323; H05B 33/22; H05B 33/12
See application file for complete search history.

(56) References Cited

U.S. PATENT DOCUMENTS

| | | |
|---|---|---|
| 7,091,660 B2 | 8/2006 | Park et al. |
| 8,110,825 B2 | 2/2012 | Obata et al. |
| 2002/0064966 A1 | 5/2002 | Seki et al. |
| 2003/0122486 A1 | 7/2003 | Yabe |
| 2004/0166761 A1 | 8/2004 | Seki et al. |
| 2005/0264186 A1 | 12/2005 | Seki et al. |
| 2005/0264187 A1 | 12/2005 | Seki et al. |
| 2005/0266169 A1 | 12/2005 | Seki et al. |

(Continued)

FOREIGN PATENT DOCUMENTS

| | | |
|---|---|---|
| JP | H11-40354 | 2/1999 |
| JP | 2003-187694 | 7/2003 |

(Continued)

OTHER PUBLICATIONS

International Search Report, mailed Jul. 21, 2015, in International Application No. PCT/JP2015/002602.

*Primary Examiner* — Roy Potter
*Assistant Examiner* — Paul Patton
(74) *Attorney, Agent, or Firm* — Greenblum & Bernstein, P.L.C.

(57) ABSTRACT

A display panel including: a substrate; and a plurality of line banks arranged along a specific direction on the substrate, wherein the line banks are each formed of plural line segments connected to one another end to end, and each have a periodic structure.

10 Claims, 11 Drawing Sheets

(56) References Cited

U.S. PATENT DOCUMENTS

| | | |
|---|---|---|
| 2007/0018152 A1 | 1/2007 | Seki et al. |
| 2008/0315760 A1 | 12/2008 | Seki et al. |
| 2009/0009075 A1 | 1/2009 | Seki et al. |
| 2009/0302333 A1 | 12/2009 | Seki et al. |
| 2010/0090203 A1 | 4/2010 | Obata et al. |
| 2012/0061697 A1 | 3/2012 | Obata et al. |
| 2012/0299033 A1 | 11/2012 | Goda |
| 2013/0248834 A1 | 9/2013 | Seki et al. |
| 2014/0225095 A1 | 8/2014 | Seki et al. |

FOREIGN PATENT DOCUMENTS

| | | | |
|---|---|---|---|
| JP | 2004-087509 | 3/2004 | |
| JP | 2004-288403 | 10/2004 | |
| JP | 2004-362818 | 12/2004 | |
| JP | 2007-115529 | 5/2007 | |
| JP | 2007-115529 A * | 5/2007 | ............ H05B 33/12 |
| JP | 2008-091070 | 4/2008 | |
| JP | 2008-091070 A * | 4/2008 | ............ H05B 33/22 |
| JP | 2008-171580 | 7/2008 | |
| JP | 2010-267416 | 11/2010 | |
| JP | 2011-090909 | 5/2011 | |
| JP | 2011-090909 A * | 5/2011 | ............ H05B 33/22 |
| JP | 2011-159406 | 8/2011 | |
| WO | 2014-115333 | 7/2014 | |

* cited by examiner

DISPLAY PANEL

TECHNICAL FIELD

The present invention relates to display panels and, more particularly, to a display panel using, for example, an organic electroluminescent (EL) element.

BACKGROUND ART

The method for fabricating an organic EL display panel is broadly divided into two types, depending on a way of forming an organic functional layer. One is forming a thin film, which is an organic functional layer, by vapor deposition, and the other is forming an organic functional layer by ink application.

The method of forming the organic functional layer by ink application significantly improves material-utilization efficiency, as compared to the vapor deposition method, and allows models of display panels to be readily switched during mass production simply by changing a program installed in manufacturing equipment.

An inkjet device is one of exemplary means for forming an organic functional layer by ink application. The device dispenses ink containing organic functional materials to a substrate to form an organic functional layer (e.g., see Patent Literature (PTL) 1).

The ink containing organic functional materials is applied to colored-light emitting regions arranged on the substrate. The colored-light emitting region as used herein refers to a region in which sub-pixels having one of red, blue, and green are aligned. For example, on a substrate of a display panel, at least three different colored-light emitting regions of three different colors are arranged parallel to one another along a specific direction. It should be noted that in a display panel, a set of the following sub-pixels may be referred to as a pixel: a sub-pixel being a unit which emits red light; a sub-pixel being a unit which emits green light; and a sub-pixel being a unit which emits blue light.

The colored-light emitting regions are partitioned sub-pixel by sub-pixel by banks (walls). Alternatively, the colored-light emitting regions may be arranged line by line, without being partitioned from one another. In the colored-light emitting regions partitioned sub-pixel by sub-pixel by banks, the banks define each sub-pixel, and an ink containing an organic functional material is supplied for each sub-pixel during the fabrication of a display panel (e.g., see PTL 2).

On the other hand, in the colored-light emitting regions arranged line by line where they are not partitioned sub-pixel by sub-pixel by banks, an ink containing an organic functional material is supplied for each line of colored-light emitting region formed of a plurality of sub-pixels (e.g., see PTL 3).

Future organic EL display panels are becoming smaller in size and higher in definition, and pitches between sub-pixels and between the colored-light emitting regions are becoming narrower. Due to narrow pitches between highly-detailed sub-pixels and between highly-detailed colored-light emitting regions, it is difficult to dispense ink to a region enclosed by banks using an inkjet device.

Figure 12:
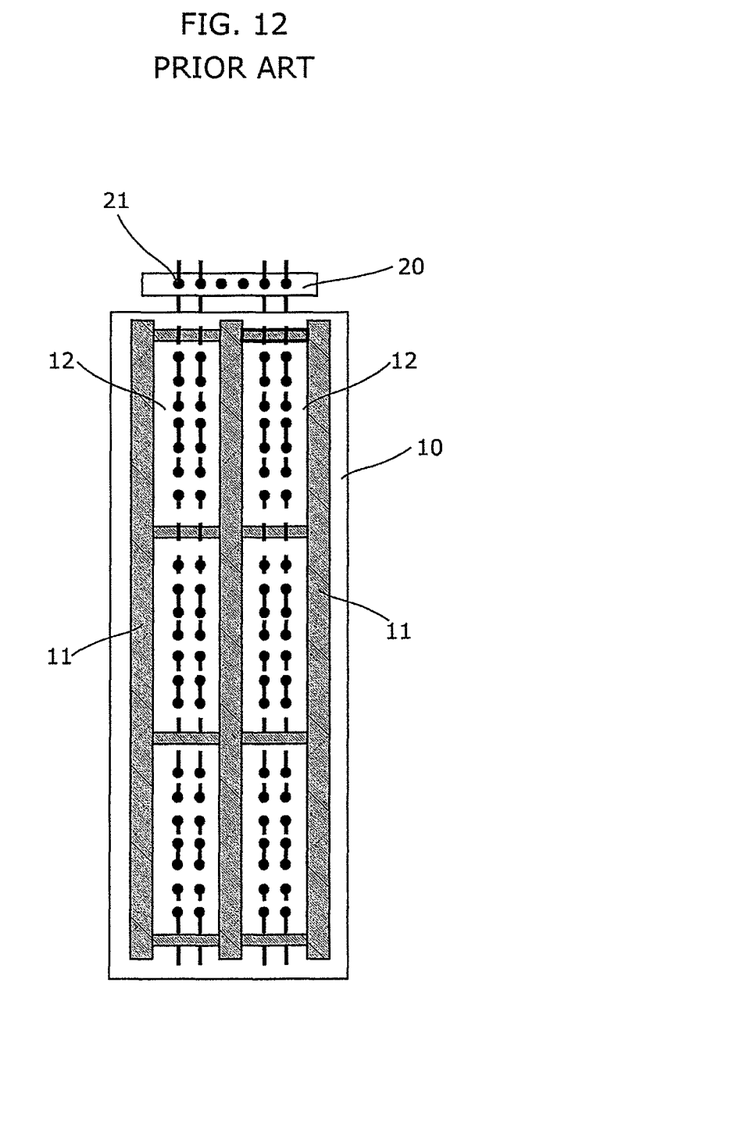
FIG. 12 is a plan view illustrating a way of applying inks to colored-light emitting regions from top to bottom, using a conventional ink-jet method.

FIG. 12 is a plan view showing a way of forming an organic functional layer on a display substrate, using an inkjet device. An inkjet head 20 applies to a substrate 10 an ink containing a dye, which is one of organic functional materials, for each colored-light emitting region 12.

(1) The inkjet head 20 included in the inkjet device is placed at the top (or at the bottom) of the figure, along the long axis of colored-light emitting regions 12 each defined by line banks 11 on the substrate 10. Preferably, the inkjet head 20 is placed such that an alignment direction of nozzles 21 is perpendicular to the long axis of the colored-light emitting regions 12.

(2) The inkjet head 20 is moved in parallel relative to the long axis of the colored-light emitting regions 12.

(3) The nozzles 21 dispense inks to the colored-light emitting regions 12 to form an organic functional layer.

The way of moving the inkjet head 20 in parallel relative to the long axis of the colored-light emitting regions 12 in this manner may also be referred to as "applying ink from top to bottom" below.

However, as described above, amounts of the inks dispensed from the respective nozzles 21 included in the inkjet head 20 vary from one nozzle 21 to another. Thus, when applying the inks to the substrate 10 of the display from top to bottom, there occurs variations in amounts of the inks that are applied to the respective colored-light emitting regions 12.

Figure 13:
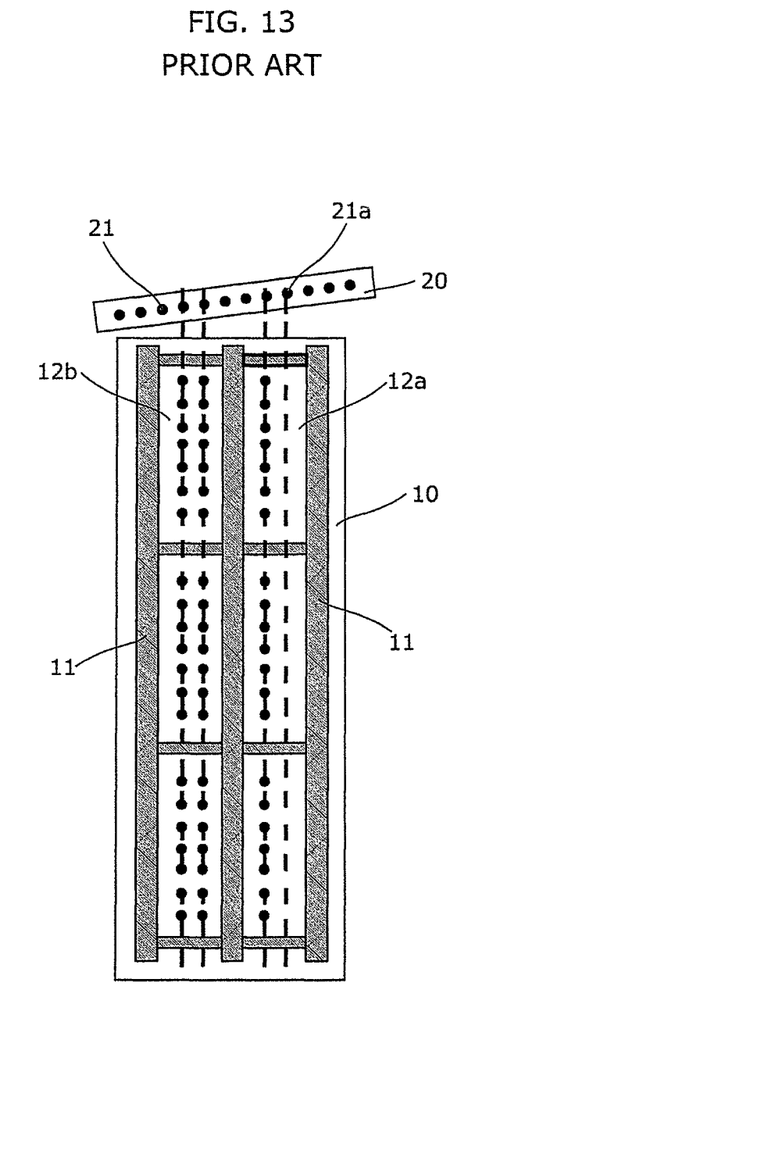
FIG. 13 is a plan view illustrating the way of applying inks to the colored-light emitting regions from top to bottom, using the conventional ink-jet method.

The above is described specifically with reference to FIG. 13, for example. FIG. 13 illustrates the components illustrated in FIG. 12 in different conditions under the same circumstance.

As illustrated in FIG. 13, if the inkjet head 20 includes a nozzle 21a (a clogged nozzle) that does not dispense ink, an amount of ink applied to a cell 12a of one colored-light emitting region 12 is less than an amount of ink applied to a cell 12b of another colored-light emitting region 12. The variations in amount of ink among the colored-light emitting regions 12 can lead to variations in thickness of organic functional layer among the colored-light emitting regions 12. The variations in thickness of organic functional layer among the colored-light emitting regions 12 can further lead to variations in luminance among the colored-light emitting regions 12, resulting in what is known as "streaks" on the organic EL display panel.

Figure 14:
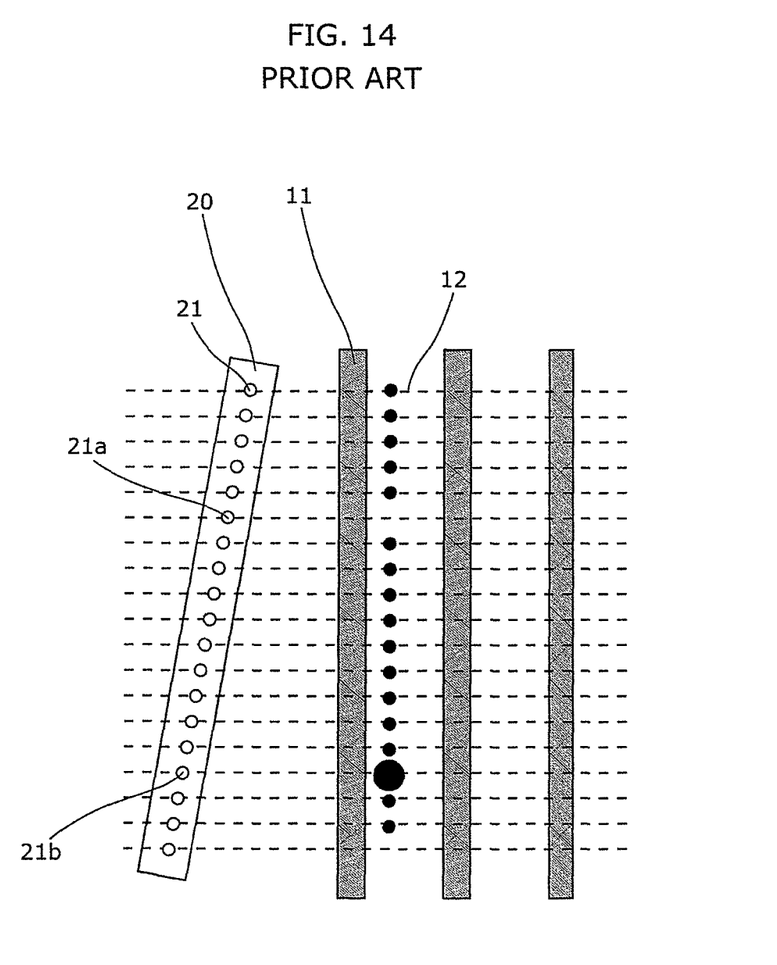
FIG. 14 is a plan view illustrating a way of applying inks to colored-light emitting regions from side to side, using another conventional ink-jet method.

A method illustrated in FIG. 14 is a way to solve the problem "streaks." FIG. 14 is a plan view illustrating positional relationship between the inkjet head 20, the line banks 11, and the colored-light emitting regions 12.

(1) The inkjet head 20 which includes the plurality of nozzles 21 is disposed on a side of the substrate 10 along the long axis of the colored-light emitting regions 12.

(2) The inkjet head 20 is moved vertically relative to the long axis of the colored-light emitting regions 12.

(3) The nozzles 21 dispense inks containing organic functional materials to the colored-light emitting regions 12 to form organic functional layer.

The way of moving the inkjet head 20 vertically relative to the long axis of the colored-light emitting region 12 in this manner may also be referred to as "applying ink from side to side" below. Ink from a greater number of nozzles 21 is applied to the colored-light emitting region 12 when applying it from side to side than when applying it from top to bottom. When applying ink from side to side, there is little difference in terms of an amount of ink applied per colored-light emitting region 12 even if the inkjet head 20 includes the nozzle 21a which dispenses no ink and a nozzle 21b which dispenses a large amount of ink.

In order to form an organic functional layer that has a uniform thickness by the inkjet head 20 dispensing inks to the colored-light emitting regions from side to side, the line banks 11 are formed in line shapes. Forming the line banks 11 in line shapes allows an organic functional layer that has a uniform thickness to be formed even if the inkjet nozzles dispense inks having different volumes or if some of them dispense no ink.

Figure 15:
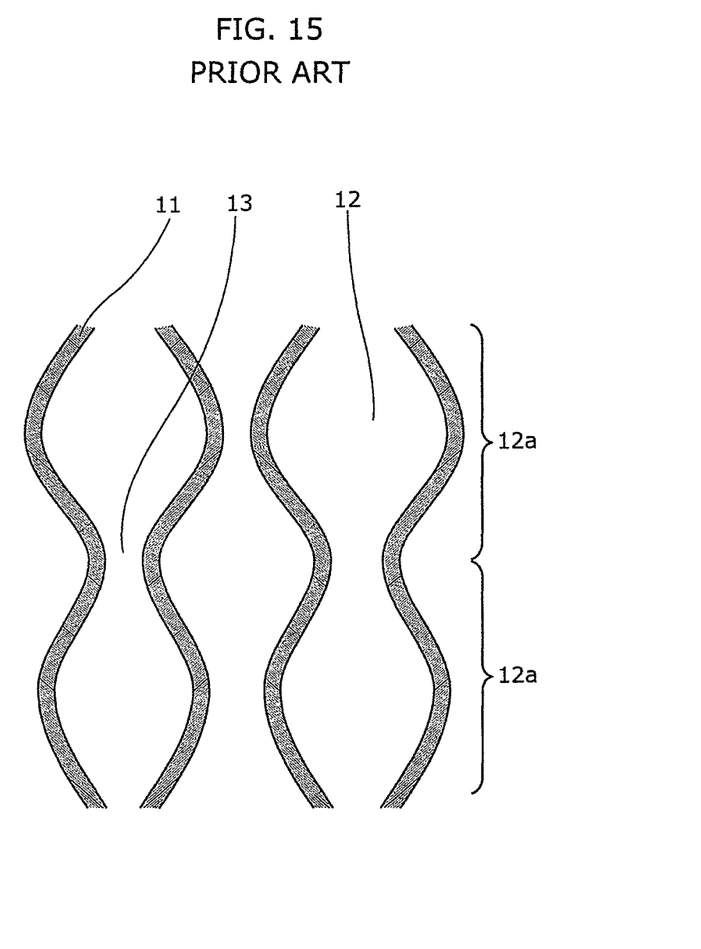
FIG. 15 is a plan view of a conventional bank structure.

Furthermore, PTL 4 discloses a honeycomb-shaped colored-light emitting region 12. FIG. 15 is a plan view of colored-light emitting regions 12 disclosed in PTL 4. The colored-light emitting regions 12 are defined by wavy line banks 11. The colored-light emitting regions 12 each include a plurality of circular cells 12a and gaps 13 between the circular cells 12a.

When the method illustrated in FIG. 14 is used to apply inks to the colored-light emitting regions 12 on a substrate which have the structure of FIG. 15, the ink is applied to the center of each cell 12a. In this way, an area to which the ink is to be applied is increased, thereby increasing a margin for deviation of a nozzle, for example.

CITATION LIST

Patent Literature

[PTL 1] Japanese Unexamined Patent Application Publication No. 2004-362818
[PTL 2] Japanese Unexamined Patent Application Publication No. 2004-87509
[PTL 3] U.S. Pat. No. 7,091,660
[PTL 4] Japanese Unexamined Patent Application Publication No. 2003-187694

SUMMARY OF INVENTION

Technical Problem

However, in the conventional structure shown in FIG. 15, the gaps 13 between the cells 12a are narrow, which results in poor ink leveling properties. A problem with the conventional structure is that an organic functional layer that has a uniform thickness cannot be formed by ink application.

An object of the present invention is to provide a display panel which has an organic functional layer the thickness of which is as uniform as possible across colored-light emitting regions.

Solution to Problem

To solve the above problem, a display panel according to the present invention includes: a substrate; and plural line banks arranged along a specific direction on the substrate, wherein the plural line banks are each formed of plural line segments connected to one another end to end, and each have a periodic structure.

Advantageous Effects of Invention

Defining each colored-light emitting region by line banks each formed of line segments increases a margin for accuracy in an inkjet device applying ink. As a result, a highly-detailed pattern formation is achieved.

Moreover, since the line banks are each formed of line segments, even if particles are present between the banks, narrow regions between adjacent cells in a colored-light emitting region can prevent, to some extent, ink that is flowing into a cell from flowing into an adjacent cell along the particles. The display panel according to the present disclosure consequently has a configuration which can cope with such particles as well.

DESCRIPTION OF EMBODIMENTS

Hereinafter, embodiments according to the present invention are to be described, with reference to the accompanying drawings.

[Embodiment 1]

Figure 1:
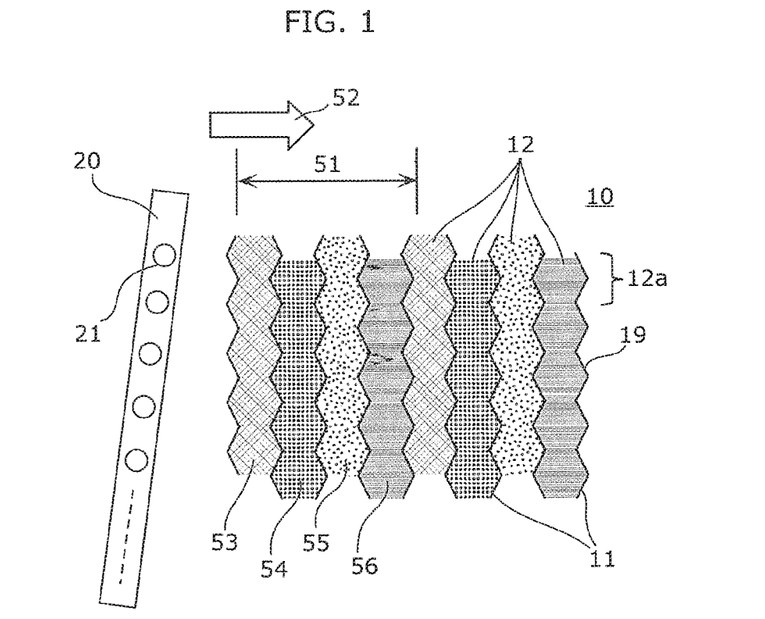
FIG. 1 is a plan view illustrating a way of applying ink to colored-light emitting regions from side to side, according to Embodiment 1.
Figure 2:
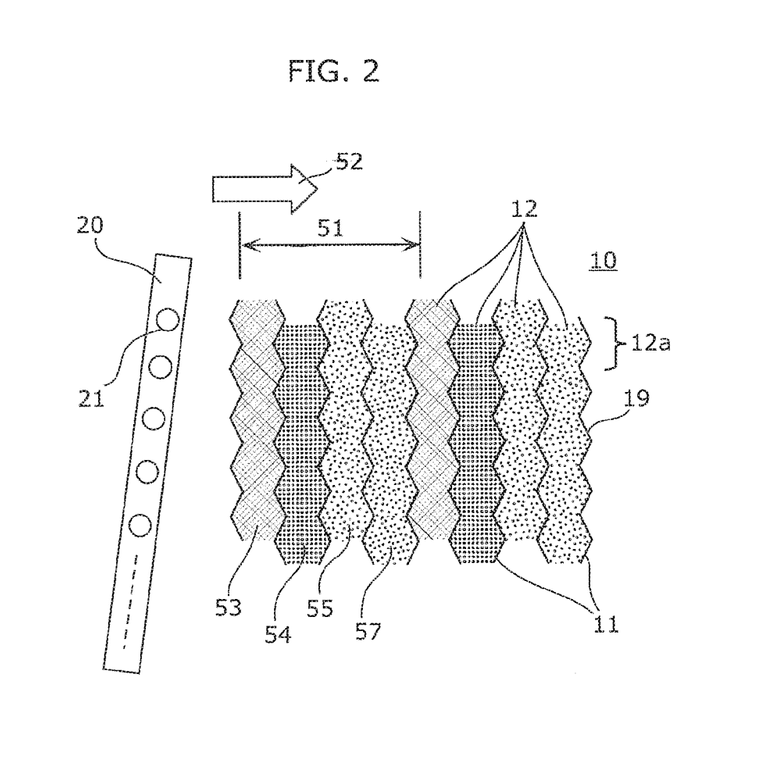
FIG. 2 is a plan view illustrating another aspect of the way of applying ink to the colored-light emitting regions from side to side.
Figure 3:
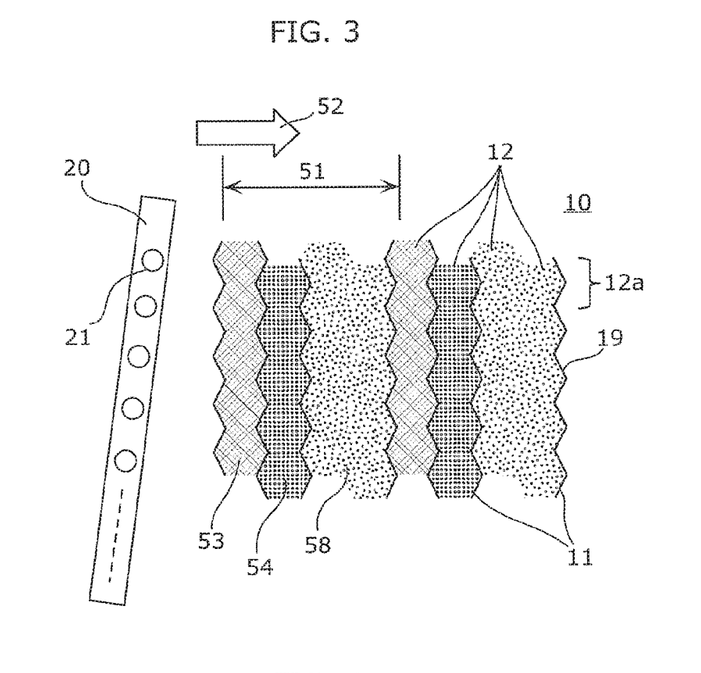
FIG. 3 is a plan view illustrating still another aspect of the way of applying ink to the colored-light emitting regions from side to side.

FIGS. 1 through 3 are plan views of close-up of an inkjet head 20, and a substrate 10 included in a display panel according to Embodiment 1.

In the present embodiment, on the substrate 10, colored-light emitting regions 12 are formed each including hexagonal sub-pixels. Specifically, sub-pixels are in hexagonal shapes and arranged in a honeycomb structure as a whole. The inkjet head 20 which includes nozzles 21 is tilted in an oblique direction relative to a printing direction 52. The inkjet head 20 prints the substrate 10 in the printing direction 52.

The colored-light emitting regions 12 are each formed between zigzag-shaped line banks 11. Adjacent line banks 11 and the substrate 10 define one colored-light emitting region 12 which is a long, thin slot. The sub-pixels correspond to cells 12a formed in the hexagonal shapes. In each colored-light emitting region 12, there is no bank which partitions adjacent cells 12a from each other. It should be noted that the colored-light emitting region 12 has a flat bottom. Ink is applied to the colored-light emitting region 12 between the line banks 11, thereby forming the sub-pixels.

The line banks 11 are each formed of a plurality of line segments 19 connected to one another end to end, and have a periodic structure. In the present embodiment, the line banks 11 each have what is known as a zigzag structure in which two line segments 19 form one cycle of the periodic structure. Adjacent line banks 11 are arranged, without contact, shifted and from one another by half a cycle.

The colored-light emitting regions 12 are shaped in elongated slots aligned in parallel to one another. In the present embodiment, the shape of each colored-light emitting region 12 in plan is a recurring cycle of an increased width portion and a reduced width portion in correspondence with a cycle of the line banks 11. In other words, the hexagonal cells 12a are aligned. The line banks 11 each have a uniform height across the increased width portion and the reduced width portion of the colored-light emitting region 12.

As illustrated in FIG. 1 for example, a red ink 53, a green ink 54, a blue ink 55, and a white ink 56 can be applied to respective colored-light emitting regions 12 within one pixel pitch 51. From concerns about life of blue ink due to materials issues, a blue ink 57 may be used in place of the white ink 56, as illustrated in FIG. 2. Providing a broad blue ink region achieves high luminance at a low current. Alternatively, the pixel area of the blue ink 55 and the pixel area of the blue ink 57 may be combined to form a region for a blue ink 58, as illustrated in FIG.

[Ink Application]

Figure 4:
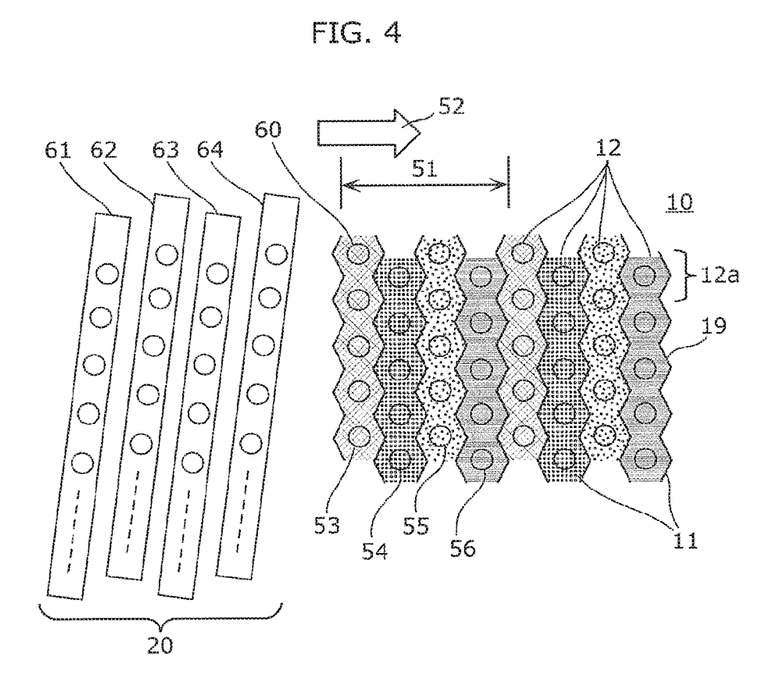
FIG. 4 is a plan view indicating positions to which inks are dispensed during the application of the inks to the colored-light emitting regions from side to side.

FIG. 4 is a plan view illustrating dispensing the inks by the inkjet head 20. In FIG. 4, a head column 61 for red included in the inkjet head 20 applies the red ink 53 to a honeycomb-shaped colored-light emitting region 12. A head column 62 for green applies the green ink 54 to another colored-light emitting region 12. A head column 63 for blue applies the blue ink 55 to still another colored-light emitting region 12. A head column 64 for white applies the white ink 56 to yet another colored-light emitting region 12.

In FIG. 4, the inkjet head 20 dispenses the inks to center positions 60 of the cells 12a in the colored-light emitting regions 12. Since the ink is dispensed to the center position 60 (the center of the hexagon) of the cell 12a in the colored-light emitting region 12, a long distance is provided from the center at which the ink is dispensed to each of line banks 11 between which the colored-light emitting region 12 is formed. As a result, the inks dispensed from the inkjet head 20 are readily introduced into the respective cells 12a of the colored-light emitting regions 12.

[Case where there is Non-Dispensing Nozzle]

Figure 5:
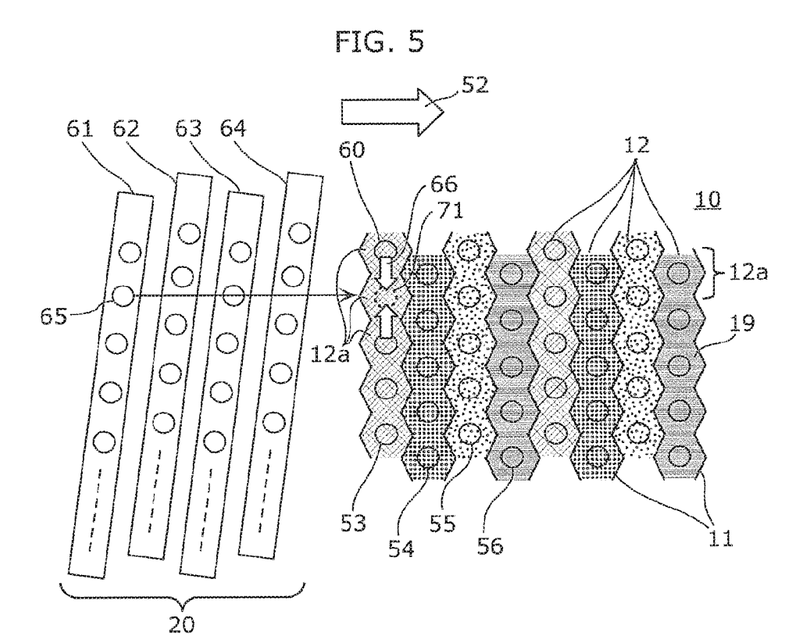
FIG. 5 is a plan view illustrating inks applied to the colored-light emitting regions from side to side when there is a non-dispensing nozzle.

FIG. 5 shows the case where the inkjet head 20 includes a non-dispensing nozzle 65. FIG. 5 corresponds to FIG. 4. As indicated by an arrow 66, due to the non-dispensing nozzle 65, an ink introduced into a cell 12a in the colored-light emitting region 12 flows into a portion 71, where ink is absent, of a different cell 12a in the same colored-light emitting region 12.

Thus, the ink applied across the colored-light emitting region 12 has a constant depth even if there is a portion to which no ink is dispensed from a nozzle. This results in an organic film that has a uniform thickness. This is due to a fact that the colored-light emitting regions 12 have hydrophilic properties (a state where ink wettability is high), and ink therefore readily flows from one cell 12a to another. Thus, the colored-light emitting regions 12 are a homogenous film as a whole.

[Case where there is Excessively-Dispensing Nozzle]

Figure 6:
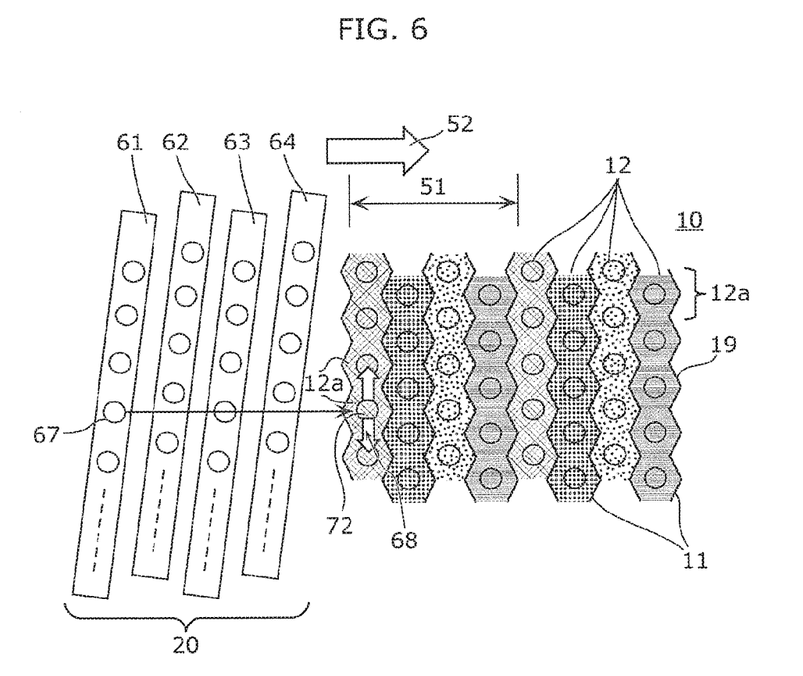
FIG. 6 is a plan view of illustrating how a volume of ink flows during the application of the inks to the colored-light emitting regions from side to side.

FIG. 6 shows the case where the inkjet head 20 includes an excessively-dispensing nozzle 67. FIG. 6 corresponds to FIG. 4. An ink excessively supplied to a portion 72 of a cell 12a in the colored-light emitting region 12 flows into a different cell 12a (a direction indicated by an arrow 68) in the same colored-light emitting region 12.

The organic film has a uniform thickness even if an ink is excessively dispensed to a portion of the colored-light emitting region 12. This is due to a fact that the colored-light emitting regions 12 have hydrophilic properties (a state where ink wettability is high), and ink therefore readily flows from one cell 12a to another. Thus, the colored-light emitting regions 12 are a homogenous film as a whole.

In the present embodiment, the line banks 11 are arranged along the short axis direction of the substrate 10, and the red, green, blue, and white colored-light emitting regions 12 in the honeycomb shapes are arranged parallel to the short axis direction of the substrate. However, the colored-light emitting regions 12 may be disposed at any orientation, insofar as they are parallel to one another in an entire view.

Moreover, in a colored-light emitting region formed between typical straight lines, if organic particles or the like are present on a substrate, a problem may occur in which applied inks are absorbed to the particles. In contrast, the colored-light emitting region 12 according to Embodiment 1 is formed between the zigzag-shaped line banks 11 that are not straight lines. This allows the flow of organic ink to be regulated better than the conventional straight line banks.

Thus, the structure of each colored-light emitting region 12 formed of a recurring cycle of the increased width portion and the reduced width portion not only allows the inkjet application to be readily implemented even in high detail, but also yields a device structure that is less prone to particles present on the substrate 10.

[Difference from FIG. 15]

Figure 7:
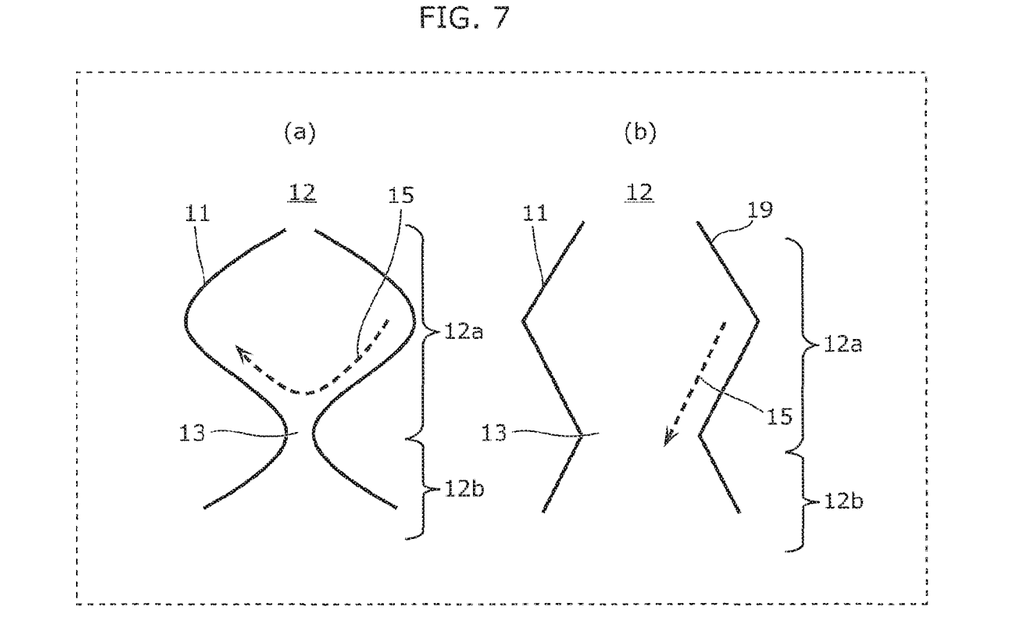
FIG. 7 is a plan view illustrating how the volume of ink flows conventionally and according to Embodiment 1, (a) showing conventional line banks, (b) showing line banks according to Embodiment 1.

Differences of the bank structure according to the present embodiment from the conventional bank structure shown in FIG. 15 are to be described. Part (a) of FIG. 7 is a schematic view showing close-up of a conventional colored-light emitting region 12. Part (b) of FIG. 7 is a schematic view showing close-up of the colored-light emitting region 12 according to Embodiment 1. The conventional colored-light emitting region 12 is formed between wavy line banks 11 which are curved, and includes a cell 12a and a cell 12b where a gap 13 between them is narrow. As a result, an ink applied to the cell 12a moves as indicated by an ink flow 15 within the cell 12a. Consequently, the cell 12a and the cell 12b yield poor leveling properties and have different thicknesses.

In other words, liquid applied to each cell thicker in the periphery and thus the cells are not leveled. The cells vary in thickness within plus or minus about 30 percent.

In contrast, the line banks 11 between the colored-light emitting region 12 according to Embodiment 1 shown in (b) are each formed of straight line segments 19 and not curved. Owing to this, ink applied to a cell 12a is likely to flow into a cell 12b adjacent to the cell 12a (the ink flow 15), and the ink applied to the cell 12a and the ink applied to the cell 12b are leveled. In other words, the thicknesses of the adjacent cells 12a and 12b are homogeneous.

Here, the ink applied to a cell is likely to move to the vicinity of the center of the cell to which the liquid has moved, rather than to the periphery. Thus, consequently, the thickness variations among the cells after ink is dried are reduced, improving the thickness variations to plus or minus about 5 percent. The result is described below and shown in Table 1.

The bank structure according to the present embodiment is different from the conventional bank structure in terms of width of the gap 13 as well, which is to be described below with reference to FIG. 8.

Preferably, the line banks 11 according to Embodiment 1 are not curved. This allows ink to flow linearly from one cell to another, and readily leveled and made homogeneous among the cells. If the line bank 11 is curved, ink applied to a cell 12a is likely to flow circularly within the cell 12a, and less likely to move widely in the colored-light emitting region 12.

[Margin for Ink Application]

Figure 8:
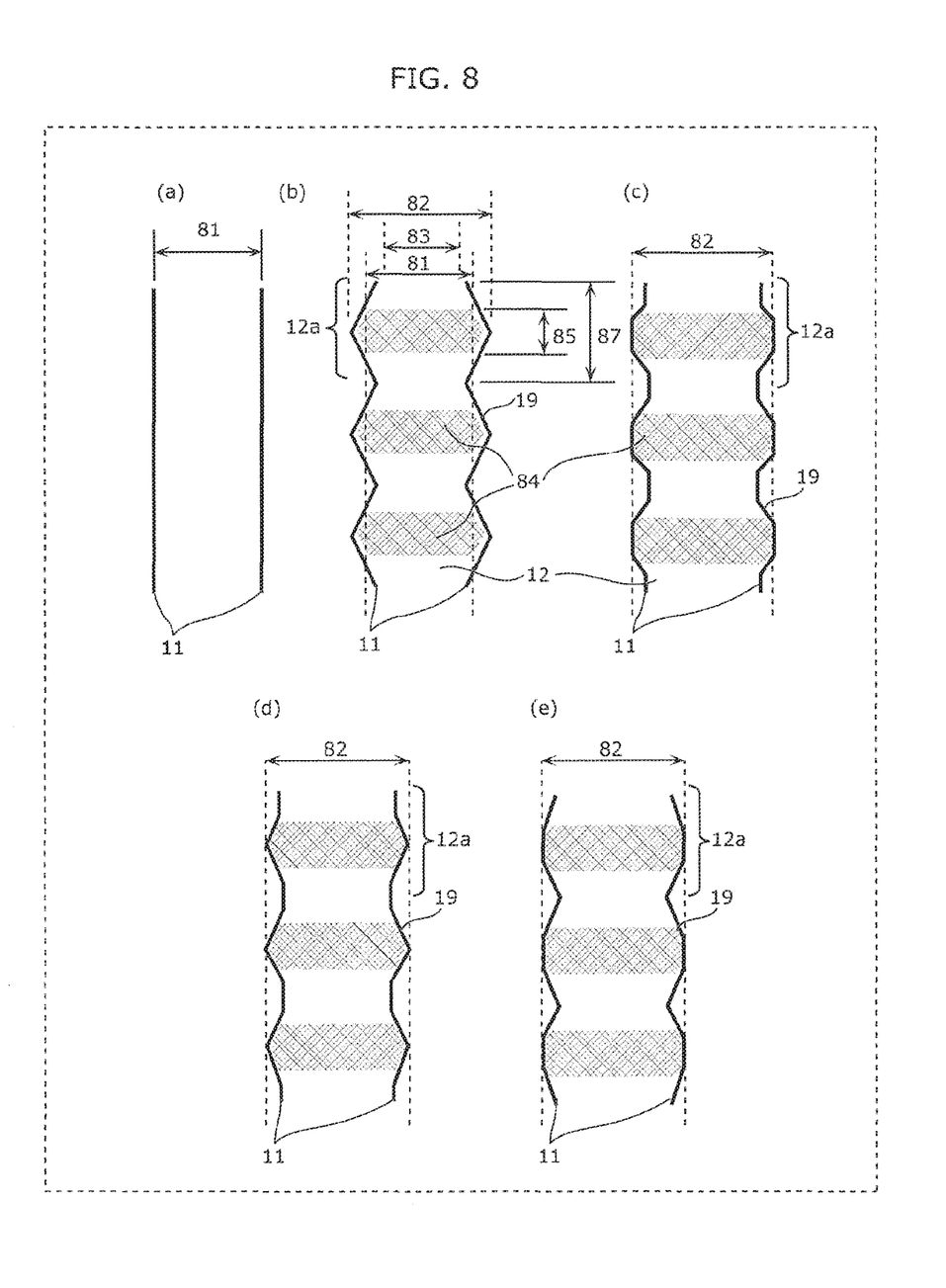
FIG. 8 is a plan view illustrating variations of the line banks according to Embodiment 1 and conventional line banks, (a) showing the conventional line banks, (b), (c), (d), and (e) showing the variations of the line bank according to Embodiment 1.

Part (a) of FIG. 8 illustrates a conventional colored-light emitting region 12, and (b) illustrates the colored-light emitting region 12 according to Embodiment 1. Parts (c), (d), and (e) illustrate variations of the line banks 11 and the colored-light emitting regions 12 between the line banks 11 according to Embodiment 1. Dark zones in the figure indicate application zones 84 to which ink is applied.

The application zone 84 is to be described with reference to (b) of FIG. 8. A conventional average width 81 is also shown in (a) for comparison. Ink is dispensed by ink-jet processing from side to side only to the application zones 84 that have a maximum width 82. This allows the ink to be dispensed to a large area of each cell, as compared to a conventional average width 81.

An example of dimensional relationships is as follows. Assume that d, which is a gap between conventional straight line banks 11 adjacent to each other, represents the average width 81 between adjacent line banks 11 according to the present embodiment.

The gap (width) as used herein refers to a distance between adjacent line banks 11 on a plane on which they are disposed, in a direction perpendicular to the extending direction of the line banks 11. Conventional line banks 11 are straight lines and arranged parallel to one another, and thus the width between the adjacent line banks 11 is constant and equal to the average width 81.

Alternatively, the average width 81 of the colored-light emitting region 12 according to the present embodiment may be a mean value of a maximum width and a minimum width between adjacent line banks 11.

The maximum width 82 of the colored-light emitting region 12 according to the present embodiment is four-thirds of d. A minimum width 83 of the colored-light emitting region 12 according to the present embodiment is two-thirds of d. A length 85 of the application zone 84 is a half of h, where h represents a length 87 of the cell 12a in the extending direction of the line banks 11 according to the present embodiment. Here, d may be regarded as an average width of the colored-light emitting region 12 according to the present embodiment.

Forming the cells 12a of the colored-light emitting region 12 into the hexagonal shapes allows the cells 12a to be disposed in the honeycomb structure as a whole, without any gap between the cells 12a. In addition, distances from the center of any one of the cells 12a of a colored-light emitting region 12 to line banks 11 between which the colored-light emitting region 12 is formed are the same. Since ink is dispensed to the center of the cell 12a, a wide margin for an area to which the ink can be dispensed is provided.

If the line banks 11 are disposed such that the colored-light emitting regions 12 have the average width 81 of d, preferably, the maximum width 82 is in a range from 1.4d to 1.9d, and the minimum width 83 is in a range from 0.4d to 0.9d. Preferably, the length 85 of the application zone 84 is in a range from 0.2d to 0.8d.

If the minimum width 83 of the colored-light emitting region 12 is less than 0.4d, ink dispensed to a cell 12a does not readily flow into an adjacent cell 12a, ending up reducing the effects to achieve the cells 12a that have a uniform thickness.

If the minimum width 83 of the colored-light emitting region 12 is greater than 0.9d, on the other hand, the ink flow from one cell to another is facilitated to a greater extent than expected. If particles are present on some of the colored-light emitting regions 12 then, the ink is absorbed to the particles, and a thickness of ink across the colored-light emitting regions 12 is insufficient. This reduces yield rate.

If the maximum width 82 of the colored-light emitting region 12 is greater than 1.9d, the minimum width 83 of colored-light emitting regions 12 adjacent to that colored-light emitting region 12 is reduced. This obstructs the ink flow from a cell 12a to an adjacent cell 12a, making it difficult to provide cells that have a uniform thickness.

If the maximum width 82 of the colored-light emitting region 12 is less than 1.4d, on the other hand, an area to which ink can be dispensed in the colored-light emitting region 12 is reduced, making it difficult to provide a margin for the dispensing area. This makes it difficult to form a highly-detailed pattern by the ink-jet processing.

If the length 85 of the application zone 84 is less than 0.2d, the number of nozzles used to apply ink to the application zone 84 from side to side is reduced, making it difficult to dispense ink droplets uniformly across the cells.

If the length 85 of the application zone 84 is greater than 0.8d, the ink flow from one cell to another is facilitated excessively, ending up suffering yield loss due to particles.

Table 1 below shows comparison of the present embodiment with the conventional bank structure shown in FIG. 15.

TABLE 1

|  | Embodiment 1 | Conventional Example in FIG. 15 |
| --- | --- | --- |
| Minimum width 83 | 0.4 d to 0.9 d | 0.3 d |
| Maximum width 82 | 1.4 d to 1.9 d | 1.3 d |
| Leveling | plus or minus 5% | plus or minus 30% |

Part (c) of FIG. 8 shows the line banks 11 in a different shape from those shown in (b). One cycle of the line bank 11 in the periodic structure is formed of four line segments 19. Some of the line segments 19 are along the extending direction of the line banks 11. Specifically, two of the four line segments 19 forming one cycle of the line bank 11 are along the extending direction of the line banks 11. In other words, in order to provide the maximum width 82, the line banks 11 have apexes that are line segments. Reduced width portions and increased width portions of the colored-light emitting regions 12 formed between adjacent line banks 11 have a constant length along the extending direction of the line banks 11.

Thus, the application zone 84 of the colored-light emitting region 12 between the adjacent line banks 11 has a width greater than or equal to the conventional average width 81 and less than or equal to the maximum width 82. It provides a margin for accuracy in ink application.

While the colored-light emitting region 12 having the honeycomb structure formed of the hexagonal cells 12a has been described above, the hexagonal shape includes not only a regular hexagonal shape, but also deformation of a hexagon. For example, the hexagonal shape may at least be a generally hexagonal shape, including a rounded corner hexagon and a cornered hexagon.

Parts (d) and (e) of FIG. 8 illustrate variations on (c). Cells 12a of (d) and cells 12a of (e) are formed, without some line segments among the line segments that are along the extending direction of the line banks 11 shown in (c) and have the constant length. The cells 12a of (b) and the cells 12a of (c) are each formed of plural shapes when viewed in plan. The cells 12a of (d) and the cells 12a of (e), on the other hand, are each formed of a pair of shapes when viewed in plan. Alternatively, adjacent cells 12a of the colored-light emitting region 12 may not be formed in the same shape.

[Application]

Figure 9:
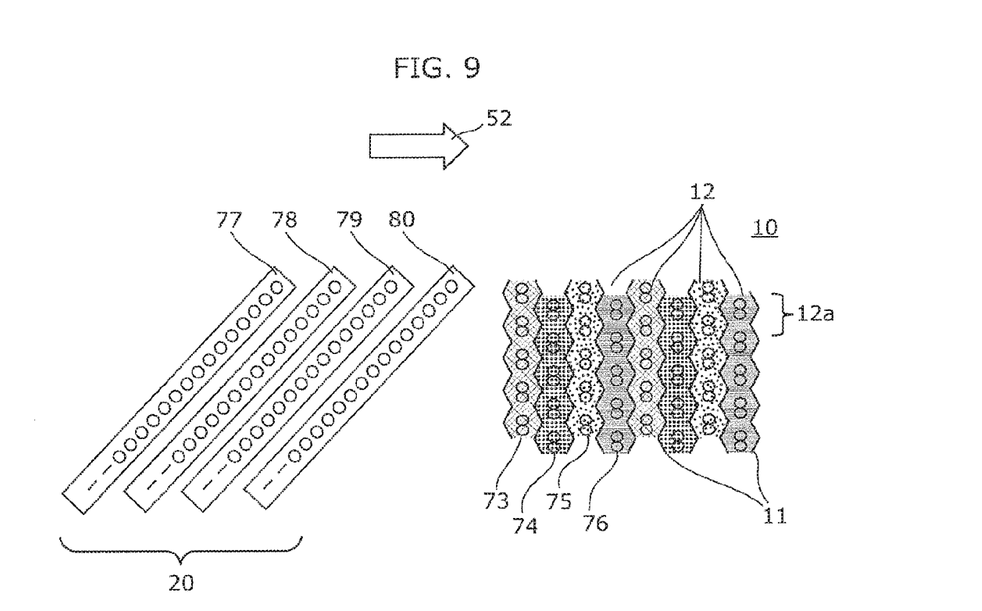
FIG. 9 is a plan view showing another example of the way of applying inks to colored-light emitting regions from side to side.

FIG. 9 is a schematic view of nozzles dispensing inks to the application zones 84 by ink-jet processing.

The inkjet head 20 is tilted to a great extent, to reduce pitches between the nozzles in the extending direction of the line banks 11. The inkjet head 20 applies inks only to the application zones 84 for the nozzles, thereby dispensing, by ink-jet processing, the inks to dispensing areas which have greater margins than the case where the line banks 11 are formed of straight lines.

A head column 77 for red, a head column 78 for green, a head column 79 for blue, and a head column 80 for white dispense different inks having different colors. This dispenses a red ink 73, a green ink 74, a blue ink 75, and a white ink 76 to different colored-light emitting regions 12. In the honeycomb-shaped colored-light emitting region 12, the ink is permitted to be dispensed to each cell where the width is greater than the average width 81, in addition to the center of each cell.

The inkjet application using a plurality of inks is carried out on the honeycomb-shaped colored-light emitting region 12, thereby allowing stable inkjet application even in the case where some nozzle fails to dispense ink.

The inks to be dispensed here have volumes of 0.5 pL to 7 pL. The higher the colored-light emitting regions 12 are detailed, the smaller the diameters of the inks need to be. Ink having a volume of 0.5 pL or less is affected by external resistance upon being dispensed, and the volume of ink is therefore limited to 0.5 pL. Desirably, ink having a volume of about 1 pL is dispensed to the colored-light emitting regions 12 if the colored-light emitting region 12 is printed at 300 ppi or greater.

Moreover, preferably, $3\sigma$ for variations in volume of ink which is dispensed is 10 percent or less. More preferably, the variations are 3 percent or less. To reduce the variations to percent or less, waveforms and voltages applied to piezoelectric devices corresponding to the dispensing nozzles may be adjusted.

[Embodiment 2]

Figure 10:
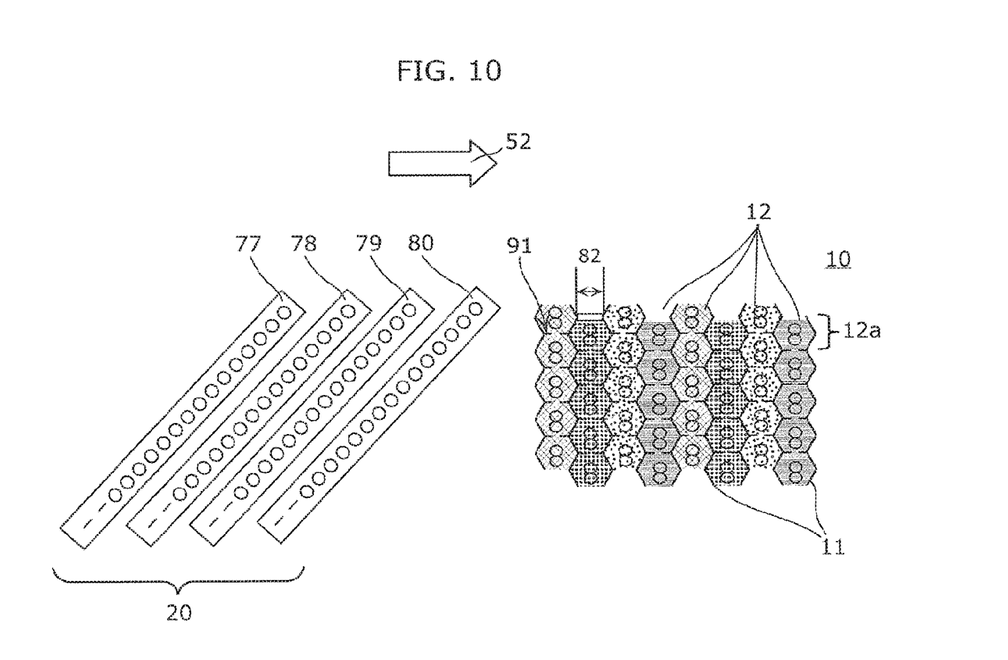
FIG. 10 is a plan view showing still another example of the way of applying the inks to colored-light emitting regions from side to side.

FIG. 10 is a plan view of Embodiment 2. FIG. 10 corresponds to FIG. 4. In Embodiment 1, there is no bank partitioning the cells 12a of the colored-light emitting region 12. In Embodiment 2, projecting partitions 91 are provided. The partitions 91 are disposed between adjacent cells 12a of the colored-light emitting region 12, wherein one partition 91 projecting from one line bank 11 does not abut another partition 91 projecting from an adjacent line bank 11. In the present embodiment, the partitions 91 are located at minimum width 83 portions of the colored-light emitting region 12, where a width between the one line bank 11 and the adjacent line bank 11 is narrowest in one cycle, to further narrow the reduced width portions of the colored-light emitting region 12. Furthermore, in the present embodiment, although the partitions 91 are provided projecting from the line banks 11 adjacent to each other, the partitions 91 are not in contact and does not completely partition between the adjacent cells 12a. Thus, ink flow between adjacent cells 12a is ensured.

In this configuration, when particles are present in the colored-light emitting region 12, the partitions 91 prevent ink from flowing along the particles.

Figure 11:
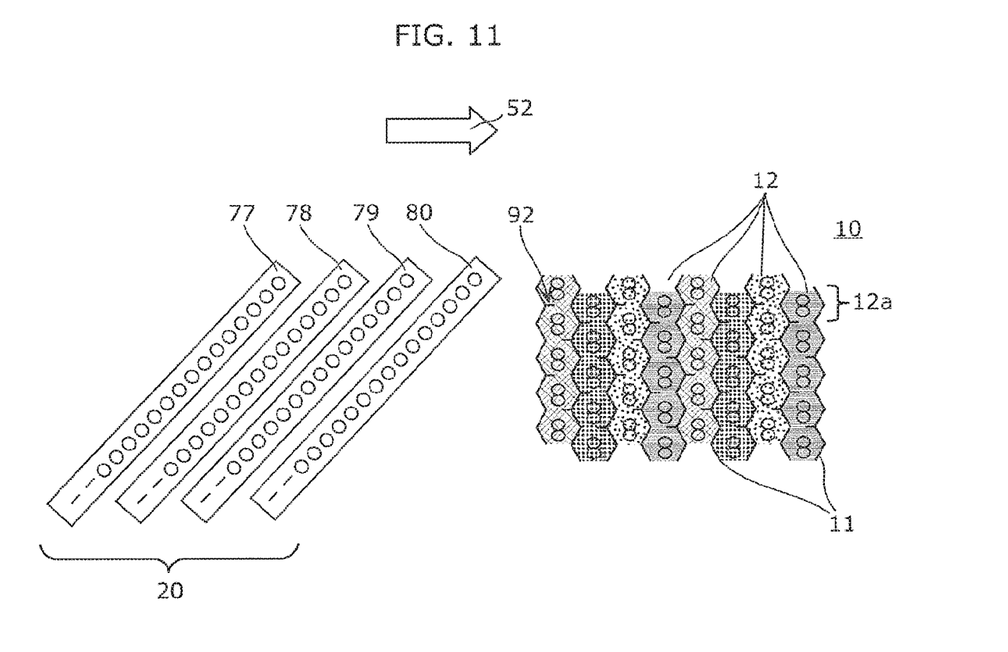
FIG. 11 is a plan view indicating positions to which the inks are dispensed during the application of inks to the colored-light emitting regions from side to side on a substrate according to another aspect of display panel.

As another example, partitions 92 may be disposed in a staggered fashion as illustrated in FIG. 11, to prevent the ink flow due to the presence of particles. The partitions 92 being disposed in the staggered fashion can prevent the ink flow along the particles.

Both cases illustrated in FIGS. 10 and 11 do not completely partition between adjacent cells 12a, which can thus ensure the ink flow between the adjacent cells 12a, and also prevent the ink flow along the particles.

The partitions 91 and 92 may have lengths less than the width of the reduced width portions (the minimum width 83) by 30 percent to 70 percent.

Setting the lengths of the partitions 91 and 92 to 30 percent of the width of the reduced width portions can prevent the attraction of the ink to organic particles or the like. If the lengths of the partitions 91 and 92 are less than 30 percent of the width of the reduced width portions, the attraction of the ink to particles cannot be prevented. If the lengths of the partitions 91 and 92 are greater than 70 percent of the width of the reduced width portions, the ink is not leveled sufficiently across the cells 12a.

It should be noted that the present invention is not limited to the embodiments described above. For example, any combination of the components described herein or another embodiment implemented without some of the components may be included within the scope of the present invention. Modifications obtained by various modifications to the above embodiments that may be conceived by those skilled in the art without departing from the spirit of the present invention, namely, without departing from the recitation in the claims appended hereto, are also included within the scope of the present invention.

One aspect of the display panel according to the present invention is a display panel which includes a plurality of pixel regions on a substrate, the pixel regions each being partitioned by banks which are each formed of a plurality of broken lines and arranged in parallel and between which the pixel regions are formed.

Moreover, the display panel according to the present invention may be the display panel, wherein the plurality of broken lines do not intersect one another, distances between the broken lines vary, rather than staying constant, the distances between the broken lines form a recurring cycle of an increased width portion wider than an average separation distance and a reduced width portion narrower than the average separation distance, the average separation distance being an average distance of the distances between the broken lines which are repetition of a hexagonal shape formed of two reduced width portions and one increased width portion.

Moreover, the display panel according to the present invention may be the display panel, wherein the plurality of broken lines do not intersect one another, distances between the broken lines vary, rather than staying constant, the distances between the broken lines form a recurring cycle of an increased width portion and a reduced width portion than an average separation distance of the distances between the broken lines, and at least one of the reduced width portion and the increased width portion has a predetermined width.

Moreover, the display panel according to the present invention may be the display panel, wherein the plurality of broken lines are straight lines and not curved.

Moreover, the display panel according to the present invention may be the display panel, wherein the reduced width portion is 0.4d or greater, where d represents the average separation distance of the distances between the broken lines.

Moreover, the display panel according to the present invention may be the display panel, wherein the reduced width portion is 0.4d or less, where d represents the average separation distance of the distances between the broken lines.

Moreover, the display panel according to the present invention may be the display panel, wherein the increased width portion is 1.4d or greater and 1.9d or less.

Moreover, the display panel according to the present invention may be the display panel, wherein the reduced width portion has a projecting bank which does not abut a projecting bank of an adjacent reduced width portion.

Moreover, the display panel according to the present invention may be the display panel, wherein the projecting bank is provided for each of the broken lines at every reduced width portion.

Moreover, the display panel according to the present invention may be the display panel, wherein the projecting bank is provided for each of the broken lines facing one another at every reduced width portion, and the projecting bank does not abut an adjacent projecting bank.

INDUSTRIAL APPLICABILITY

The display according to the present invention is applicable to displays of televisions, computer monitors, tablets, and smartphones, for example.

REFERENCE SIGNS LIST 10 substrate
11 line bank
12 colored-light emitting region
12a cell
12b cell
13 gap
15 ink flow
19 line segment
20 inkjet head
21 nozzle
21a nozzle
21b nozzle
51 pixel pitch
52 printing direction
53 red ink
54 green ink
55 blue ink
56 white ink
57 blue ink
58 blue ink
60 center position
61 head column for red
62 head column for green
63 head column for blue
64 head column for white
65 non-dispensing nozzle
66 arrow
67 excessively-dispensing nozzle
68 arrow
71 portion where ink is absent
72 portion to which ink is excessively is supplied
73 red ink
74 green ink
75 blue ink
76 white ink
77 head column for red
78 head column for green
79 head column for blue
80 head column for white
81 average width
82 maximum width
83 minimum width
84 application zone
85 length of application zone
91 partition
92 partition

The invention claimed is:

1. A display panel, comprising:
a substrate; and
plural line banks arranged along a specific direction on the substrate,
wherein the plural line banks are each formed of plural line segments, each line bank having periodic hexagonal subpixel structures that are connected to one another end to end.

2. The display panel according to claim 1,
wherein one cycle of the periodic hexagonal subpixel structures of each of the plural line banks is formed of two line segments among the plural line segments, and
adjacent line banks, among the plural line banks, are disposed without contact and shifted from one another by half a cycle.

3. The display panel according to claim 1,
wherein one cycle of the periodic hexagonal subpixel structures of each of the plural line banks is formed of four line segments among the plural line segments, and
adjacent line banks, among the plural line banks, are disposed without contact and shifted from one another by half a cycle.

4. The display panel according to claim 1,
wherein the plural line banks are not curved.

5. The display panel according to claim 1,
wherein in one cycle, a minimum width between adjacent line banks among the plural line banks is greater than or equal to 0.4 times an average width between the adjacent line banks.

6. The display panel according to claim 5,
wherein the minimum width is less than or equal to 0.9 times the average width between the adjacent line banks.

7. The display panel according to claim 1,
wherein in one cycle, a maximum width between adjacent line banks among the plural line banks is greater than or equal to 1.4 times an average width between the adjacent line banks and less than or equal to 1.9 times the average width between the adjacent line banks.

8. The display panel according to claim 1, further comprising:
partitions projecting from the plural line banks, wherein one partition projecting from one line bank does not abut another partition projecting from an adjacent line bank.

9. The display panel according to claim 8,
wherein the partitions projecting from the plural line banks are located at positions where a width between the one line bank and the adjacent line bank is narrowest in one cycle.

10. The display panel according to claim 8,
wherein the one partition projecting from the one line bank and the another partition projecting from the adjacent line bank are facing each other, without contact.

* * * * *